United States Patent [19]
Ivey et al.

[11] Patent Number: 6,090,222
[45] Date of Patent: Jul. 18, 2000

[54] HIGH PRESSURE GAS CLEANING PURGE OF A DRY PROCESS VACUUM PUMP

[75] Inventors: Kenneth C. Ivey, Castle Rock; Aaron L. LaBrie, Vancouver, both of Wash.

[73] Assignee: Seh-America, Inc., Vancouver, Wash.

[21] Appl. No.: 09/192,279

[22] Filed: Nov. 16, 1998

[51] Int. Cl.[7] .................................................... B08B 5/00
[52] U.S. Cl. ........................... 134/21; 134/18; 134/22.1; 134/22.18; 134/31; 134/42
[58] Field of Search .............................. 134/18, 21, 22.1, 134/22.18, 31.42

[56] References Cited

U.S. PATENT DOCUMENTS

| | | | |
|---|---|---|---|
| 4,734,018 | 3/1988 | Taniyame et al. | 417/423 R |
| 5,057,658 | 10/1991 | Cano et al. | 210/168 |

FOREIGN PATENT DOCUMENTS

| | | |
|---|---|---|
| 0 791 665 A1 | 8/1997 | European Pat. Off. |
| 1-113597 | 5/1989 | Japan . |
| 05222559 | 8/1993 | Japan . |
| 5-321835 | 12/1993 | Japan . |
| 9-27458 | 1/1997 | Japan . |
| 9-909 | 1/1997 | Japan . |
| 9-173824 | 7/1997 | Japan . |
| 0112178 | 5/1998 | Japan . |
| 2036963 | 6/1995 | Russian Federation . |

OTHER PUBLICATIONS

"Vacuum Pumps Are Running Dry," *Chemical Engineering* (Jun. 1992) pp. 121, 123–126, 129, 131, 132.
Woodrow D. Farrow "Dry Vacuum Pumps Used In CVD Nitride Applications," *Solid State Technology* (Nov. 1993), pp. 69, 70, 72.
Kim Stroup "Quest For Improving LPCVD Vacuum Pump Operation," *Semiconductor International* (Aug. 1993), pp. 74–76.
A.P. Troup "Dry Pumps Operating Under Harsh Conditions In the Semiconductor Industry," *J. Vac. Sci. Technol.* A, vol. 7, No. 3 (May/Jun. 1989), pp. 2381–2386.
A.P. Troup et al., "Six Years of "Dry Pumping": A Review of Experience and Issues," *J. Vac Sci. Technol.* A 9 (3), (May/Jun. 1991), pp. 2048–2052.
John Baliga, "Vacuum Pump Designs Adjust To Harsher Conditions," *Semiconductore International* (Oct. 97), pp. 86–88, 90.
"Particles and Contamination In Dry Pumps", *European Semiconductor* (May 1990), pp. 16 & 17.
R Bahnen et al. "Increased Reliability Of Dry Pumps Due To Process Related Adaptation And Prefailure Warning," *Vacuum* vol. 44 Nos. 5–7, (1993), pp. 709–712.
"Taking The Pressure Off Enviromental Pollution," *Processing*, (Nov. 1993), pp. 20 & 21.
H.P. Berges et al. "Handling Of Particles In Forevacuum Pumps," *Vacuum*, vol. 41, Nos. 7–9, (1990) pp. 1828–1832.

*Primary Examiner*—Randy Gulakowski
*Assistant Examiner*—S. Carrillo
*Attorney, Agent, or Firm*—Oliff & Berridge, PLC

[57] ABSTRACT

A high pressure gas cleaning purge cleans silicon oxide dust deposits from inside a dry vacuum pump while installed on a crystal grower. The high pressure gas cleaning purge is performed before or after each crystal is grown. The high pressure gas flow is injected into the inlet of the dry vacuum pump and repeatedly turned on and off to create differing turbulent flow patterns within the pump. The differing turbulent flow patterns effectively remove substantial quantities of the silicon oxide dust deposited in the pump during crystal growing.

9 Claims, 3 Drawing Sheets

HIGH PRESSURE GAS CLEANING PURGE OF A DRY PROCESS VACUUM PUMP

BACKGROUND OF THE INVENTION

This invention relates to a system for cleaning a dry process vacuum pump and, in particular, a system using a high pressure gas cleaning purge to clean a dry process vacuum pump on a Czochralski-type (CZ) crystal grower.

In the semiconductor industry, semiconductor crystals are typically grown in a CZ crystal growing furnace. During the crystal growing process, the chamber of the CZ furnace is typically maintained at various levels of vacuum.

To maintain the reduced pressure in the CZ furnace, a vacuum pump is run continuously during the crystal pulling process. The vacuum pump is subjected to substantial quantities of silicon oxide dust, a byproduct of the process inside the CZ furnace. In the past, oil-sealed vacuum pumps were used. However, the oil present in an oil-sealed pump is a potential source of vacuum and process gas contamination. Additionally, maintaining filters and exhaust oil-mist separators proves to be a significant expense.

To avoid the problems associated with oil-sealed vacuum pumps, some manufacturers use a dry pump as the vacuum pump on a CZ crystal grower. In contrast to the oil seals used in an oil-sealed pump, a dry pump relies on extremely close tolerances between its rotors and stators to provide the necessary seals within the pump. The absence of oil in a dry pump avoids the above mentioned problems associated with an oil-sealed pump. However, the extremely small gaps between the rotors and stators of a dry pump can be filled by the silicon oxide dust, resulting in increased current load on the pump motor. Allowed to continue unchecked, this increased load may result in overload of the motor, tripping a circuit breaker and causing an abort of the crystal growing run. Aborts are extremely expensive due to the associated production down time and product loss.

FIG. 1 shows a dry vacuum pump 10 having a vacuum pump inlet 50 connected to a crystal grower 30 by way of a vacuum pipe 40 and a booster pump 20. The gases drawn from the crystal grower 30 by the dry vacuum pump 10 are exhausted to a building exhaust system 70 by way of a vacuum pump exhaust 60. Traditionally, dry pumps used to pump harsh processes or particulate-laden gases use a "cleaning cycle" at some point before, during, or after a run. The pump cleaning system shown in FIG. 1 circulates atmospheric air 90 through dry vacuum pump 10 in an effort to remove silicon oxide dust deposited in the dry vacuum pump 10 during the crystal growing process. During the cleaning process, cleaning cycle valve 80 is opened and the dry vacuum pump 10 draws large amounts of atmospheric air 90 through the dry vacuum pump 10. During the crystal growing process, cleaning cycle valve 80 is closed.

SUMMARY OF THE INVENTION

In order to reduce the build up of silicon oxide dust inside a dry vacuum pump on a CZ crystal grower, the invention provides high pressure gas purging of the dry vacuum pump. In particular, the high pressure gas cleaning purge of the invention injects a high pressure gas, such as compressed dry air (CDA), into the inlet of the dry pump after each crystal growing run or cycle is completed. The system of the invention includes a pressure regulator and two solenoid valves. One solenoid valve switches between a closed position in which no flow is allowed, and an open position in which atmospheric air is allowed to flow into the dry vacuum pump. A second solenoid valve switches between an open position in which high pressure purge gas is allowed to flow into the dry vacuum pump and a closed position in which the high pressured purge gas is not allowed to flow. Injecting large volumes of high pressure gas increases the pressure inside the pump, resulting in the removal of the oxides within. During cleaning, the first solenoid valve and the second solenoid valve are alternately opened and closed, causing the high pressure purge gas to repeatedly start and stop flowing. The turbulent flow of the high pressure purge gas within the dry vacuum pump changes with each stopping and starting of the high pressure purge gas flow. As compared to continuous high pressure purge gas flow, the differing turbulent flow patterns created by repeatedly stopping and starting the high pressure purge gas flow results in substantially improved removal of the silicon oxide dust deposits inside the pump.

BRIEF DESCRIPTION OF THE DRAWINGS

The foregoing and further objects, features, and advantages of the invention will be described in or apparent from the following description of embodiments with reference to the accompanying drawings, wherein like numerals are used to represent like elements and wherein.

DETAILED DESCRIPTION OF PREFERRED EMBODIMENTS

Figure 2:
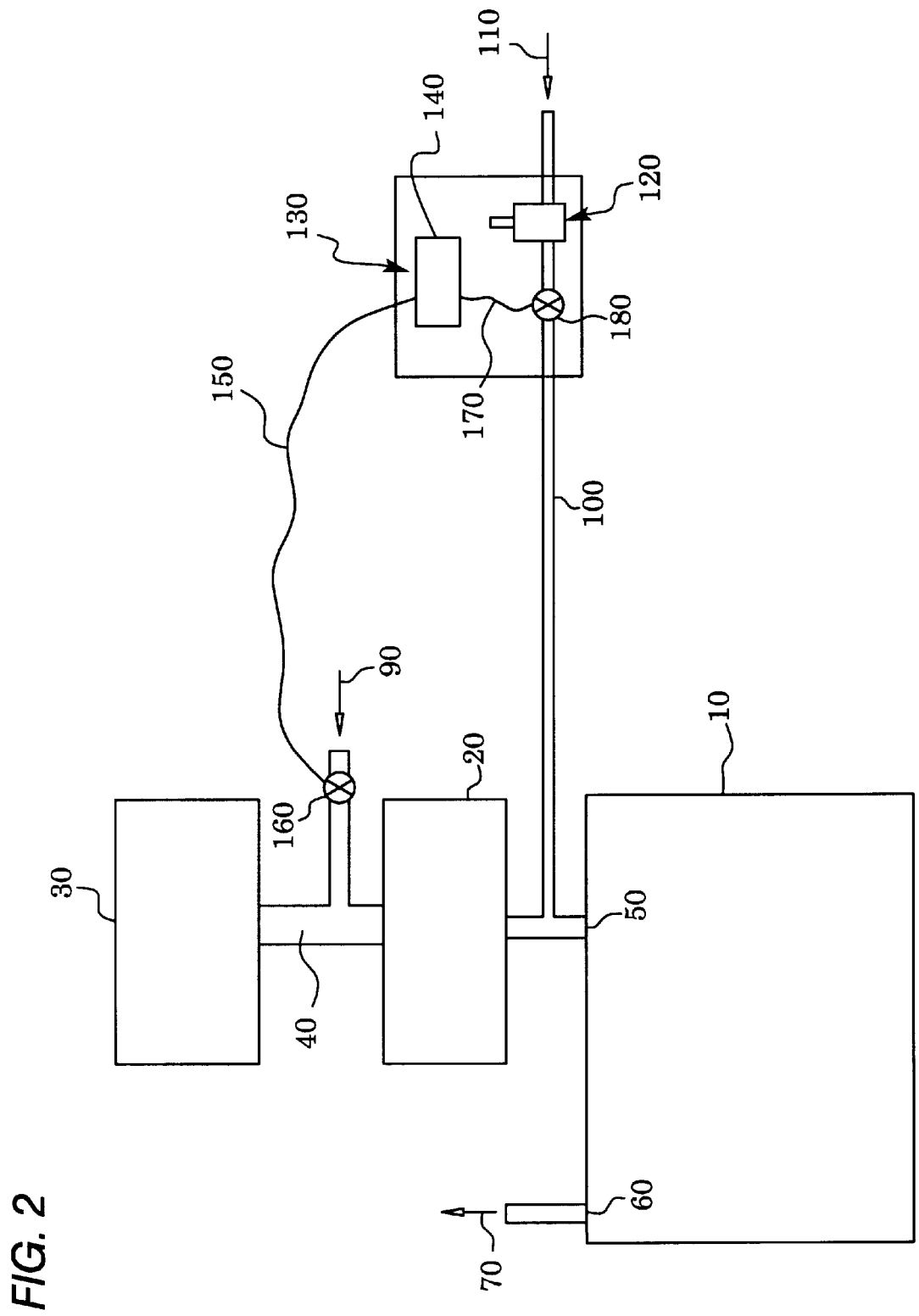
FIG. 2 is a schematic drawing of one embodiment of the invention.

FIG. 2 shows an example of the invention in which a vacuum pump inlet 50 of a dry vacuum pump 10 is connected to a crystal grower 30 by way of a vacuum pipe 40 and a booster pump 20. The dry vacuum pump 10 maintains the required vacuum in the crystal grower 30 during the crystal growing process by drawing gases from the crystal grower 30 and exhausting them through the vacuum pump exhaust 60 to the building exhaust system 70. Other structures including dry vacuum pumps exist to which the invention can be applied.

Figure 1:
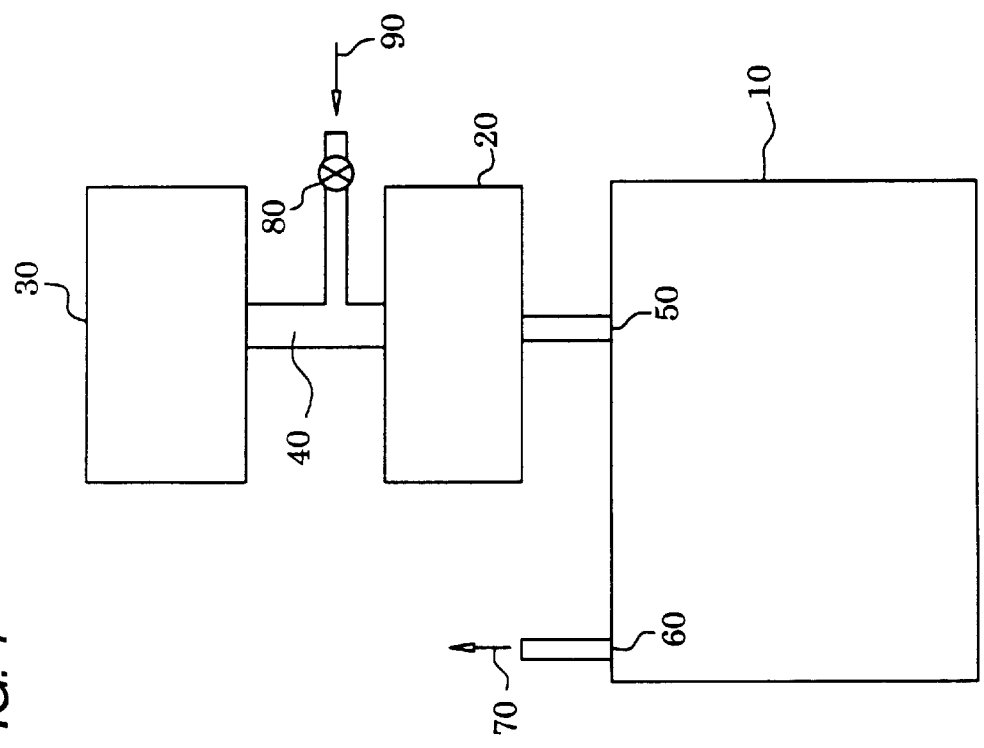
FIG. 1 is a schematic drawing of a conventional cleaning system in which atmospheric air is drawn through a pump during a cleaning cycle.

Unlike the cleaning system of FIG. 1, the invention introduces high pressure gas to the vacuum pump inlet 50 through, for example, a high pressure gas line 100 in addition to introducing atmospheric gas 90. The invention uses a controller 130 which, upon receiving a high pressure cycle start signal 140, controls two valves, solenoid valves in this example, atmospheric gas valve 160 and high pressure gas valve 180. Atmospheric gas valve 160 and high pressure gas valve 180 are controlled through atmospheric gas valve signal 150 and high pressure gas valve signal 170, respectively. Atmospheric gas valve 160 is switched between an open position which allows the introduction of atmospheric gas 90 to vacuum pump inlet 50 by way of vacuum pipe 40 and booster pump 20, and a closed position which prevents the flow of atmospheric gas 90. High pressure gas valve 180 is switched between an open position which allows the flow of high pressure gas from high pressure gas source 110 through high pressure gas line 100 into vacuum inlet pump 50, and a closed position which prevents the flow of high pressure gas. A pressure regulator 120 is provided to regulate the discharge pressure of the high pressure gas.

The flow of high pressure gas through the dry vacuum pump 10 dislodges and removes the silicon oxide dust previously deposited in the dry vacuum pump during the crystal growing process. By opening high pressure gas valve 180 and, at the same time, closing atmospheric gas valve 160, high pressure gas flows through and cleans dry vacuum pump 10. After a certain period of time the path of a constant flow of high pressure gas through the dry vacuum pump 10 stabilizes and, therefore, dislodges and removes silicon oxide dust in only certain locations within the dry vacuum pump 10. While a constant flow of high pressure gas through the dry vacuum pump 10 dislodges and removes some of the silicon oxide dust, improved cleaning results from repeatedly cycling the introduction of high pressure gas and atmospheric gas.

In order to change the high pressure gas flow pattern through the dry vacuum pump 10, the high pressure gas valve 180 is closed while, at the same time, the atmospheric gas valve 160 is opened. Then, the high pressure gas valve 180 is reopened and the atmospheric gas valve 160 is closed. This alternating procedure is repeated for a certain period of time until the dry vacuum pump 10 is sufficiently cleaned. Each time the high pressure gas valve 180 is closed and reopened, the high pressure gas can flow through the dry vacuum pump 10 along a different path and, therefore, dislodge and remove silicon oxide dust deposited in different locations within the dry vacuum pump 10. The different flow paths are a result of different turbulent flow created by, for example, differing contours inside the pump due to the dislodging of portions of the silicon oxide dust.

The system shown in FIG. 2 is just one example of the invention. Other structures that cause an alternating high pressure/atmospheric gas flow through the pump could similarly clean dust deposits from the pump. In addition, the invention includes systems in which the gas flow alternates between a high pressure and a lower pressure gas flow, where the lower pressure is above below or at atmospheric pressure.

Figure 3:
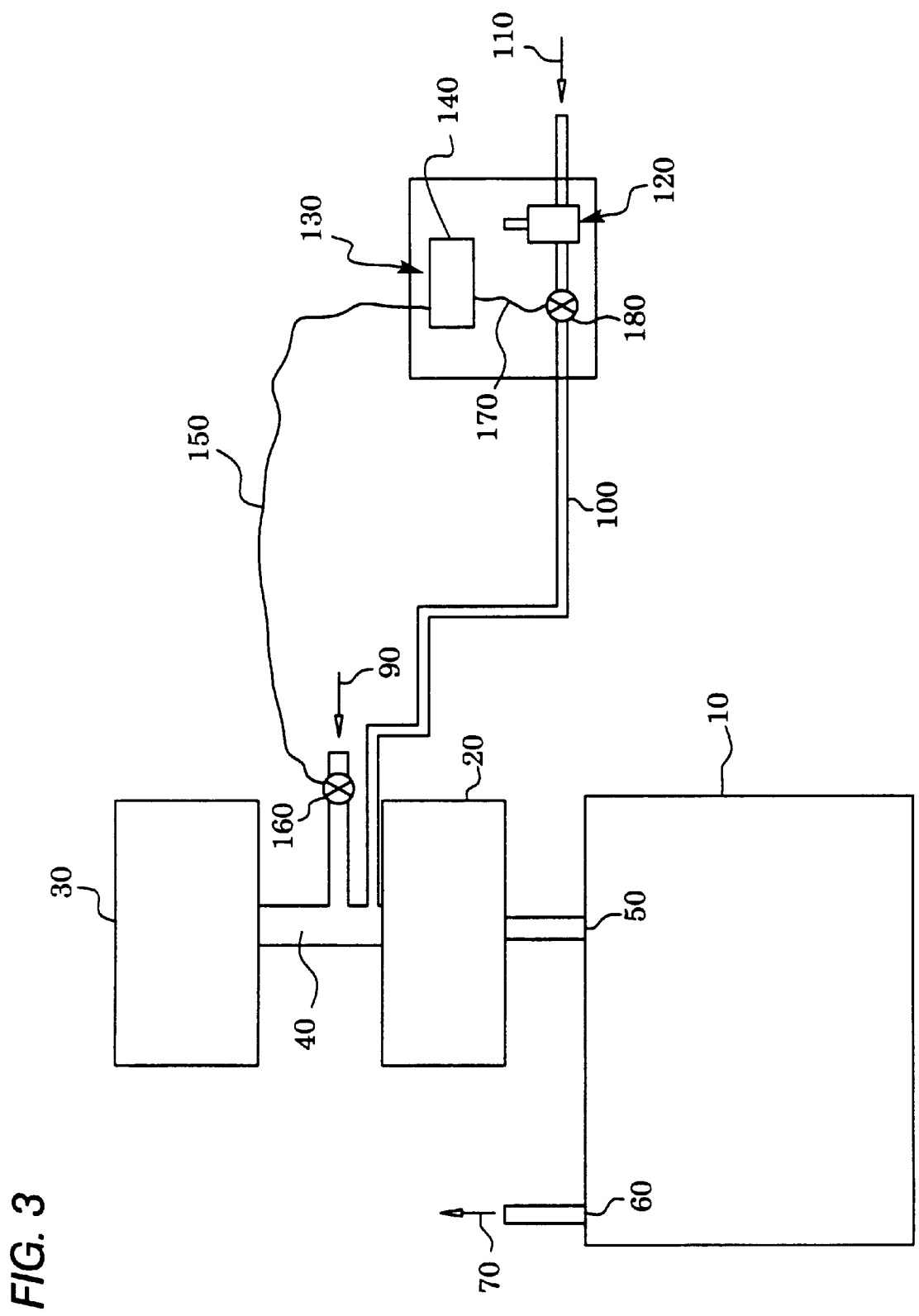
FIG. 3 is a schematic drawing of another embodiment of the invention.

While the high pressure gas is shown in FIG. 2 as being introduced to the vacuum pump inlet 50 downstream of the booster pump 20, the high pressure gas can also be introduced upstream of the booster pump 20 as shown in FIG. 3.

While it is preferred to use compressed dry air as the high pressure gas, other high pressure gases can be used, such as argon, nitrogen, or other inert gases or combination of gases.

The invention provides the advantage of cleaning a dry vacuum pump in order to avoid clogging, and eventual failure of the pump due to silicon oxide dust without requiring removal or disassembly of the dry vacuum pump. By avoiding disassembly and or removal of the dry vacuum pump, maintenance costs and crystal grower down time are reduced, resulting in increased productivity of the crystal grower. In addition, by performing the cleaning procedure of the invention after each crystal growing process, the chances of dry vacuum pump failure during crystal growing, and the associated product loss, is greatly reduced.

While the invention has been described with reference to embodiments thereof, it is to be understood that the invention is not limited to the disclosed embodiments or structures. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A method of cleaning a dry vacuum pump on a crystal grower, the method comprising:

operating the dry vacuum pump;

supplying a first gas to an inlet of the dry vacuum pump through a fist gas valve at a first pressure;

supplying a second gas to the inlet of the dry vacuum pump through a a second gas valve at a second pressure which is higher than said first pressure; and controlling the first gas valve and the second gas valve such that the first gas valve and the second gas valve open and close in opposition to one another to create gas pulses which dislodge contaminants from the dry vacuum pump, thereby cleaning said dry vacuum pump.

2. The method of claim 1, further comprising regulating the second pressure of the second gas with a regulator.

3. The method of claim 1, wherein the first gas is an inert gas at atmospheric pressure.

4. The method of claim 1, wherein the first gas is atmospheric air.

5. The method of claim 1, wherein the second gas is compressed dry air.

6. The method of claim 1, wherein the second gas is an inert gas.

7. The method of claim 1, wherein the second gas is introduced directly into the inlet of the dry vacuum pump without flowing through a booster pump which is connected to the dry vacuum pump and located upstream of the dry vacuum pump.

8. The method of claim 1, wherein the second gas flows through a booster pump which is connected to the dry vacuum pump and located upstream of the dry vacuum pump.

9. The method of claim 1, wherein the second gas is supplied to the inlet of the dry vacuum pump upstream of the dry vacuum pump when no booster pump is present.

* * * * *